United States Patent
Marty et al.

(10) Patent No.: US 7,456,071 B2
(45) Date of Patent: Nov. 25, 2008

(54) METHOD FOR FORMING A STRONGLY-CONDUCTIVE BURIED LAYER IN A SEMICONDUCTOR SUBSTRATE

(75) Inventors: Michel Marty, Saint Paul de Varces (FR); Philippe Coronel, Barraux (FR); François Leverd, Saint Ismier (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/123,318

(22) Filed: May 6, 2005

(65) Prior Publication Data

US 2005/0191818 A1    Sep. 1, 2005

Related U.S. Application Data

(62) Division of application No. 10/678,954, filed on Oct. 3, 2003, now abandoned.

(30) Foreign Application Priority Data

Oct. 3, 2002    (FR)    .................... 02 12278

(51) Int. Cl.
    *H01L 21/331*    (2006.01)
(52) U.S. Cl. .................. 438/370; 438/361; 438/342; 257/586; 257/593; 257/E21.445
(58) Field of Classification Search ............... 438/370, 438/361, 342; 257/593, 586, E21.445, E21.446, 257/E21.372, E21.385

See application file for complete search history.

(56) References Cited

U.S. PATENT DOCUMENTS

| 4,169,000 | A | * | 9/1979  | Riseman ............... 438/422 |
| 4,810,667 | A | * | 3/1989  | Zorinsky et al. ......... 438/355 |
| 4,887,144 | A | * | 12/1989 | Cook et al. ............. 257/513 |
| 4,888,300 | A | * | 12/1989 | Burton ................. 438/404 |
| 4,933,733 | A |   | 6/1990  | Iranmanesh et al. |
| 5,213,999 | A | * | 5/1993  | Sparks et al. ............ 438/639 |
| 5,424,228 | A | * | 6/1995  | Imai ................... 438/366 |
| 5,475,257 | A | * | 12/1995 | Hashimoto et al. ........ 257/587 |
| 5,567,649 | A |   | 10/1996 | Lesk et al. |
| 5,621,239 | A | * | 4/1997  | Horie et al. ............. 257/499 |
| 5,643,821 | A | * | 7/1997  | Beasom ................ 438/355 |
| 5,801,089 | A | * | 9/1998  | Kenney ................ 438/589 |
| 5,859,469 | A | * | 1/1999  | Rynne ................. 257/592 |

(Continued)

FOREIGN PATENT DOCUMENTS

JP    08148504    *    7/1996

OTHER PUBLICATIONS

French Search Report from French Patent Application No. 02/12278, filed Oct. 3, 2002.

(Continued)

*Primary Examiner*—Douglas M. Menz
*Assistant Examiner*—Steven J. Fulk
(74) *Attorney, Agent, or Firm*—Lisa K. Jorgenson; James H. Morris; Wolf, Greenfield & Sacks, P.C.

(57) ABSTRACT

An integrated circuit including a buried layer of determined conductivity type in a plane substantially parallel to the plane of a main circuit surface, in which the median portion of this buried layer is filled with a metal-type material.

31 Claims, 4 Drawing Sheets

U.S. PATENT DOCUMENTS

| | | | |
|---|---|---|---|
| 6,028,344 A * | 2/2000 | Hashimoto | 257/587 |
| 6,424,020 B1 | 7/2002 | Vu et al. | |
| 6,482,710 B2 * | 11/2002 | Oda et al. | 438/311 |
| 2002/0084506 A1 * | 7/2002 | Voldman et al. | 257/511 |

OTHER PUBLICATIONS

Patent Abstracts of Japan vol. 1996, No. 10, Oct. 31, 1996 & JP 08 148504 A (Mitsubishi Electric Corporation).

"SOI Bipolar Structure And The Fabrication Processes For Same" IBM Technical Disclosure Bulletin, IBM Corp., New York, US, vol. 35, No. 6, Nov. 1, 1992, pp. 10-13, XP000314041 ISSN: 0018-8689.

Patent Abstracts of Japan vol. 010, No. 027 (E-378) Feb. 4, 1986 & JP 60 187055 A (Hitachi Seisakusho KK; Others: 01).

Berger H. H. et al. "Method Of Producing Transistors With Optimum Base Contact" IBM Technical Disclosure Bulletin, IBM Corp. New York, US, vol. 23, No. 4, Sep. 1980, pp. 1487-1488, XP000806083 ISSN: 0018-8689.

Lee C-S et al. "A New Wide-Dimensional Freestanding Microstructure Fabrication Technology Using Laterally Formed Porous Silicon As A Sacrificial Layer" Sensors And Actuators A, Elsevier Sequoia S.A., Lausanne, CH, vol. 84, No. 1-2, Aug. 1, 2000, pp. 181-185, XP004213000 ISSN: 0924-4247.

* cited by examiner

METHOD FOR FORMING A STRONGLY-CONDUCTIVE BURIED LAYER IN A SEMICONDUCTOR SUBSTRATE

CROSS REFERENCE TO RELATED APPLICATIONS

This application is a division of prior application Ser. No. 10/678,954, filed Oct. 3, 2003, now abandoned entitled INTEGRATED CIRCUIT WITH A STRONGLY-CONDUCTIVE BURIED LAYER, which is incorporated herein by reference.

BACKGROUND OF THE INVENTION

1. Field of the Invention

The present invention relates to the field of semiconductor integrated circuits. More specifically, the present invention relates to improving the conductivity of a buried layer.

The present invention will more specifically be described in the context of the forming of a buried collector layer of a bipolar transistor, but those skilled in the art will realize from reading the present application and as underlined at the end of the present description, that the present invention applies generally to the formation of deep strongly-conductive layers in a semiconductor substrate.

2. Discussion of the Related Art

FIG. 1 very schematically shows a bipolar transistor structure formed in a semiconductor substrate. This bipolar transistor is, in the specific described embodiment, formed in an N-type layer 1 formed by epitaxy on a P-type substrate 2. Under the active area where the transistor is to be formed, an implantation intended to form a heavily-doped N-type buried layer 3 will have been formed, generally prior to the epitaxy. The active transistor area is laterally delimited by a silicon oxide well 5 etched into the surface of epitaxial layer 1, currently designated as an STI, for Shallow Trench Insulation. Inside of the active area are formed a P-type base region 7 and an N-type emitter region 8. Many methods are known to form such regions in properly localized fashion and to take contacts on these regions. Reference will, for example, be made to U.S. Pat. No. 5,953,600 which is incorporated herein by reference. The transistor collector is formed of a portion of epitaxial layer 1 and of an area 9 also of type N implanted opposite to the emitter. The collector is contacted by an $N^+$-type buried layer 3 and by an $N^+$-type conductive well 10 crossing the insulating well 5 and joining the buried layer 3.

When such a transistor is to be operated at a high frequency, one of the main limiting parameters appears to be the collector access resistance, that is, the sum of lateral resistance R1 of buried layer 3 and of vertical resistance R2 of collector well 10.

Various solutions are known to minimize the resistance of collector well 10, by strongly increasing the doping level, by reducing its height, or by forming an opening and filling it with polysilicon and/or other strongly-conductive materials. Thus, the main element of the collector access resistance remains resistance R1 of buried layer 3. Further, the doping of this layer cannot be increased to a maximum, especially since it exhibits risks of exodiffusion to the epitaxial layer and of creation of a ghost layer during epitaxy.

It should further be noted that buried layer 3 has a dual function. On the one hand, it ensures a contact with collector region 1, 9, and on the other hand, it is of a conductivity type opposite to that of the substrate on which the epitaxial layer is formed, to ensure a junction isolation and enable proper biasing of the substrate.

SUMMARY OF THE INVENTION

An object of the present invention is to increase the conductivity of a buried layer while maintaining its double function of contact and junction isolation with respect to the substrate.

Another object of the present invention is to provide various methods to obtain such a buried layer with an improved conductivity.

Another more specific object of the present invention is to form the buried collector layer and the associated contact for a bipolar transistor.

To achieve these and other objects, the present invention provides an integrated circuit comprising a buried layer of determined conductivity type in a plane substantially parallel to the plane of a main circuit surface, in which the median portion of this buried layer is filled with a metal-type material.

According to an embodiment of the present invention, the buried layer is a sub-collector layer of a bipolar transistor.

According to an embodiment of the present invention, the metal-type material is titanium nitride.

The present invention also provides a method for forming a buried layer in a semiconductor substrate of an integrated circuit, comprising the steps of providing, at the location where the buried layer is desired to be formed, a layer portion made of a material selectively etchable with respect to the rest of the semiconductor material, doping the semiconductor substrate according to a selected conductivity type on either side of said layer portion, digging an opening extending from the integrated circuit surface to said layer portion, removing said layer portion by isotropic etch, and filling the cavity thus formed with a metal-type material.

According to an embodiment of the present invention, the layer portion is delimited by an insulating wall.

According to an embodiment of the present invention, the layer portion is a silicon-germanium region formed by epitaxy on a silicon substrate and itself covered with a silicon epitaxial layer.

According to an embodiment of the present invention, the layer portion is a silicon oxide region, formed on a silicon substrate and coated with a silicon layer.

According to an embodiment of the present invention, the layer portion is a hollowed region formed in advance in the semiconductor substrate.

The foregoing objects, features and advantages of the present invention will be discussed in detail in the following non-limiting description of specific embodiments in connection with the accompanying drawings.

DETAILED DESCRIPTION

Figure 1:
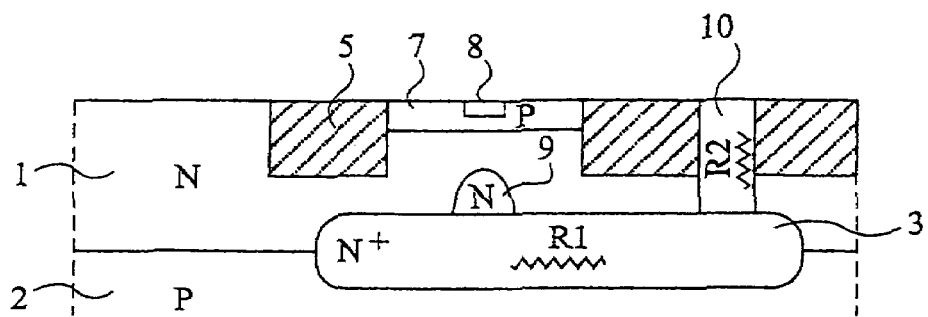
FIG. 1, previously described, is a simplified cross-section view of a bipolar transistor according to the state of the art.
Figure 2:
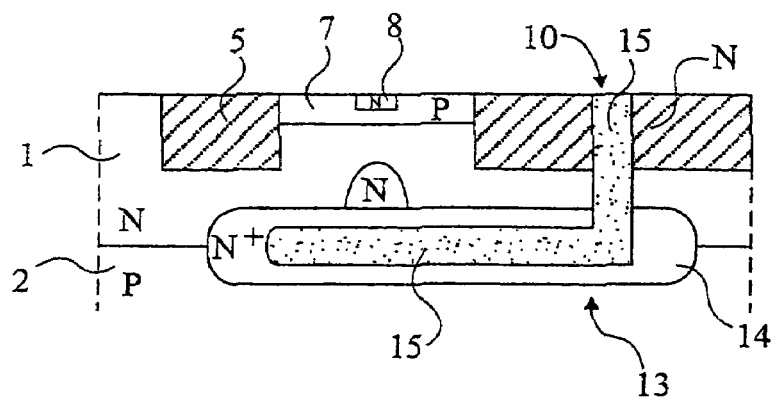
FIG. 2 is a simplified cross-section view of a bipolar transistor provided with a buried layer according to the present invention.

FIG. 2 shows a bipolar transistor comprising a modified buried layer according to the present invention. Buried layer 3 is replaced with a buried layer 13 having as its periphery 14, like buried layer 3 of FIG. 1, a heavily-doped silicon layer of the desired conductivity type. However, the core of this buried layer is replaced with a strongly-conductive layer 15, preferably a metal-type layer. Collector well 10 is preferably filled with the same material 15 as that forming the core of buried layer 13. The conductive material is for example copper deposited by electrochemical deposition or any other strongly-conductive material adapted to filling a cavity such as a conductive oxide, a metal silicide, or a titanium or tantalum nitride, or another material exhibiting the same features. Material 15 may also comprise at its periphery a metal, or another strongly-conductive material such as a nitride or a silicide, and have a core of another nature, for example, polysilicon or even silicon oxide.

According to the present invention, given that most of the conductivity of the buried layer is ensured by metal core 15, peripheral heavily-doped area 14 may be less heavily doped than buried layer 3 of prior art. Indeed, it is enough for this layer to exhibit a good ohmic contact with metal core 15. Risks of exodiffusion to the upper epitaxial layer during epitaxy and of creation of a ghost layer are thus limited.

The forming of epitaxial layers with metal-type cores according to the present invention enables reducing, by a factor of at least 10, the value of resistance R1 exhibited in relation with FIG. 1, and enables reducing the doping of peripheral region 14, which simplifies the manufacturing. Especially, if peripheral region 14 is less heavily doped than in prior art, the size of the extension of the doped region during anneals decreases, which further improves the device.

Three embodiments of a buried layer according to the present invention will now be described as examples only.

EXAMPLE 1

Substrate Comprising an SiGe Layer

FIGS. 3A to 3D illustrate four successive steps of a first example of manufacturing of a buried layer according to the present invention.

Figure 3A:
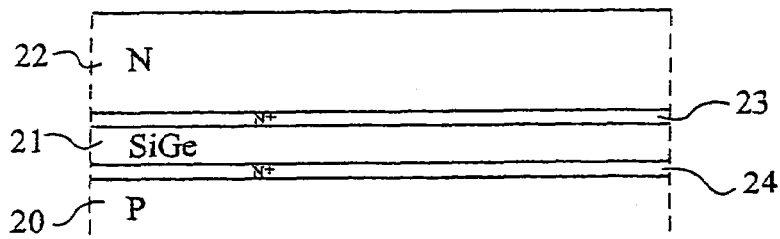
FIGS. 3A to 3D are cross-section views illustrating successive steps of a first manufacturing mode of a transistor according to the present invention.

As illustrated in FIG. 3A, the process starts from a P-type silicon substrate 20 on which a silicon-germanium layer (SiGe) 21 has been formed by epitaxy. On layer 21 is formed by epitaxy an N-type silicon layer 22. At least the portion which will correspond to the active area of the component which is desired to be manufactured is surrounded with N+ regions 23 and 24. This can, for example, be obtained by heavily doping the SiGe during its epitaxial growth, the N+ region then forming by diffusion in the silicon during the subsequent thermal steps. An implantation after growth of the SiGe, or a deep implantation after forming of epitaxial layer 22, may also be performed. These implantations are preferably localized, only under the active region. Preferably still, a heavily-doped N-type layer, a germanium-silicon layer, a heavily-doped N-type silicon layer, and a lightly-doped N-type layer may be successively grown; the use of successive epitaxies especially enables reducing anneals.

Figure 3B:
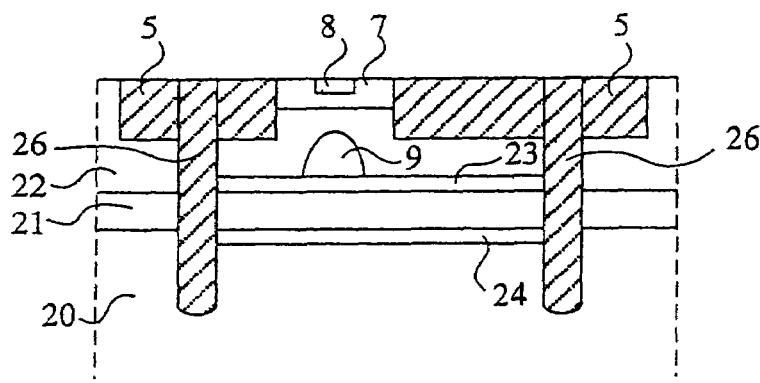

Then, as illustrated in FIG. 3B, the usual steps of the forming of a bipolar transistor, similar to those mentioned in relation with FIG. 1, are also carried out. However, in this case, a deep insulating wall, deeper than SiGe layer 21, designated by reference numeral 26, has also been formed in addition to shallow insulating well 5. A first advantage of such an insulating wall is to avoid, for heavily-doped N-type regions, laterally diffusing towards neighboring components in the various anneals. The insulating walls are not necessarily completely filled with an insulator, but possibly only their outer walls are coated with an insulator, the rest being filled with polysilicon, which is often easier to deposit. The same elements as those described in relation with FIG. 1 are then formed, that is, the layers and base and emitter contacts 7 and 8, and possibly a collector implantation 9.

Figure 3C:
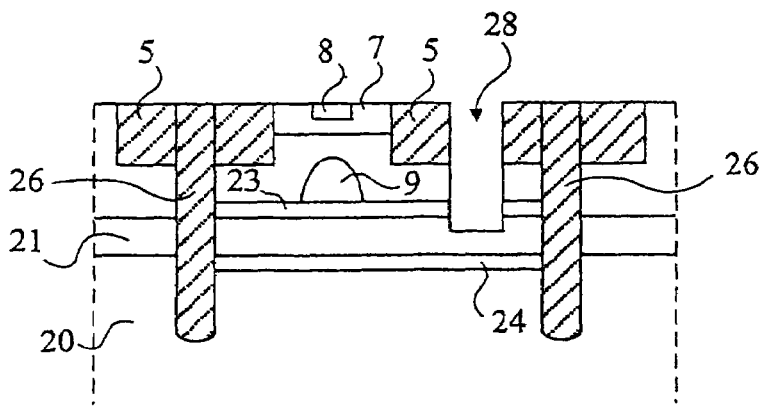

At the step illustrated in FIG. 3C, an opening 28 is made in well 5, this opening extending to join SiGe layer 21. It should be noted that in practice, there generally exist upper insulating layers above the structure, resulting from the emitter and base region manufacturing processes. Thus, opening 28 will also cross these insulating layers not shown. Opening 28 has been shown as slightly penetrating into the SiGe layer. In practice, a first vertical anisotropic etch of well 5 followed by a second vertical anisotropic etch of the silicon of epitaxial layer 22 will be performed, to reach SiGe region 21.

Figure 3D:
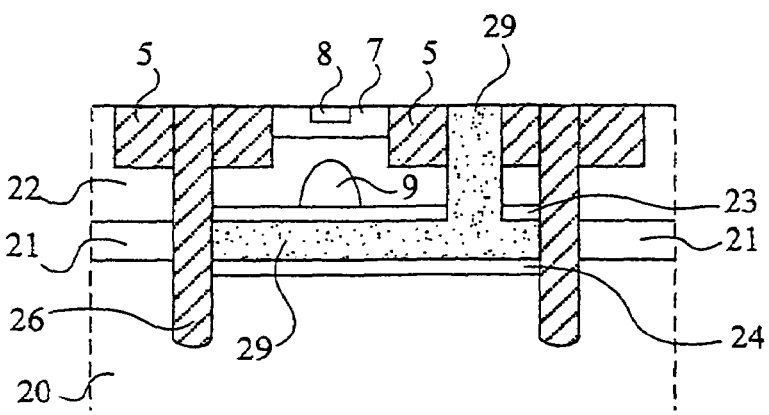

At the step illustrated in FIG. 3D, an isotropic etch by a product selectively etching the SiGe is performed to completely remove the portion of SiGe layer delimited by wall 26 and form a cavity at the location which was taken up by this layer portion. Isotropic SiGe plasma etch methods are known, which exhibit a selectivity greater than 30 between the SiGe etching and the silicon and silicon oxide etching. Finally, titanium nitride (TiN) 29 which fills the cavity thus created or at least coats its internal walls is finally deposited by chemical vapor deposition (CVD), or by atomic deposition processes currently called ALD in the art. Normally, an almost complete filling by TiN 29 appears to have been performed, as shown in FIG. 3D. For this filling, one of the other previously-mentioned conductive materials could also be used.

EXAMPLE 2

SOI-Type Substrate

Figure 4A:
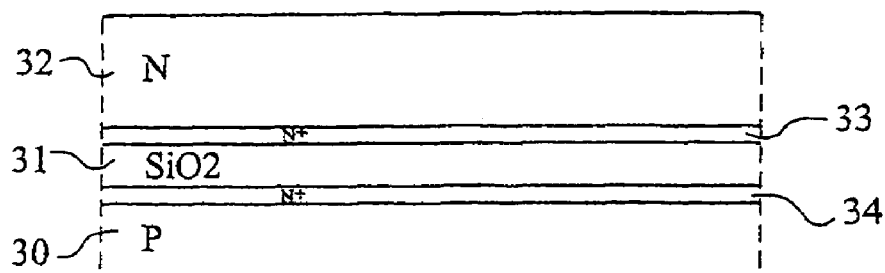
FIGS. 4A to 4C are cross-section views illustrating successive steps of a second manufacturing mode of a transistor according to the present invention.
Figure 4B:
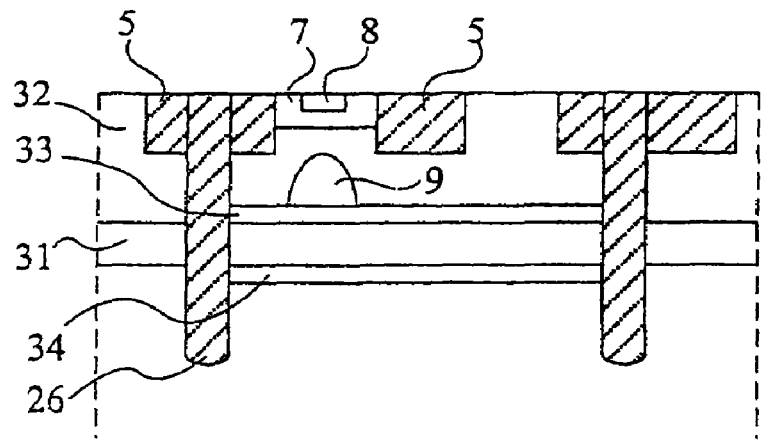
Figure 4C:
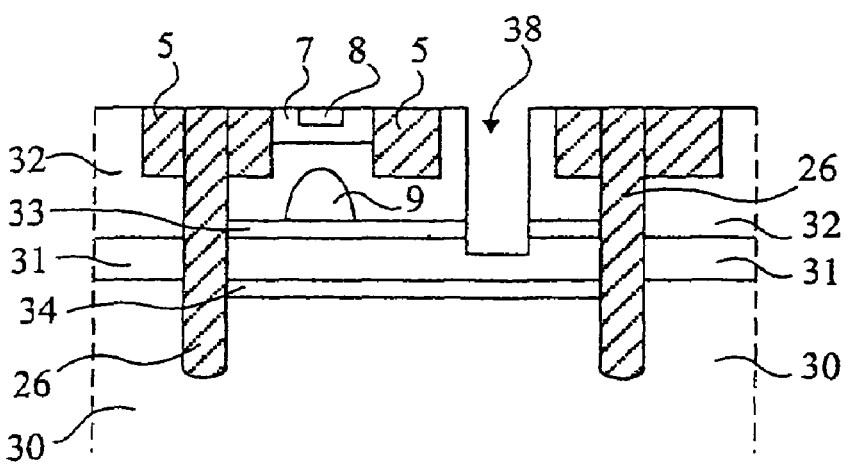

FIGS. 4A to 4C illustrate successive steps of a second example of manufacturing of a buried layer according to the present invention.

As illustrated in FIG. 4A, the process starts from an SOI-type structure, comprising a substrate 30, for example of P-type silicon, a silicon oxide layer 31, and an epitaxial lightly-doped N-type silicon layer 32. Oxide layer 31 is surrounded with heavily-doped N-type regions 33 and 34 obtained by any known method, as indicated previously. Possibly, in an SOI-type structure obtained by assembly of two silicon wafers, these heavily-doped N-type regions may be formed before assembling the two wafers intended to form the structure.

Then, steps similar to those described in relation with FIG. 3B are carried out to obtain the structure shown in FIG. 4B.

After this, as illustrated in FIG. 4C, an opening 38 is formed, which extends to reach silicon oxide layer 31. Preferably, as shown in FIG. 4B, the region where opening 38 will be formed is a reserved silicon portion inside of oxide well 5. Then, as illustrated in FIG. 4C, opening 38 does not reach the edges of well 5 but is entirely formed in the silicon. This has the advantage that, at the next step during which the silicon oxide layer portion 21 delimited by wall 26 is etched, the walls of well 5 are not simultaneously etched. In this case also, deep peripheral walls 26 will preferably exhibit an outer surface coated with silicon nitride to avoid etching of these walls at the same time as of $SiO_2$ region 31. In a last phase, opening 38 and the cavity provided in the layer portion of SiO₂ delimited by walls 26 are filled with a conductive material, as described in the context of the first example.

EXAMPLE 3

Substrate with a Pre-Formed Cavity

Figure 5A:
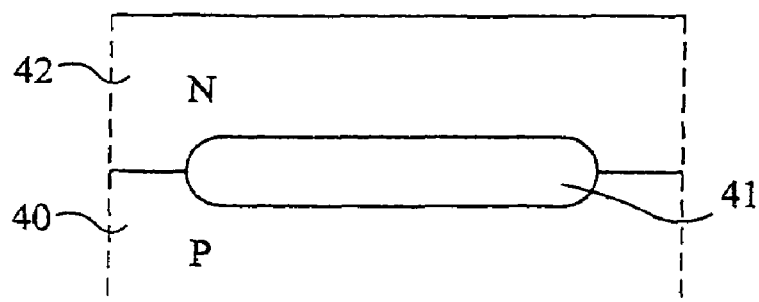
FIGS. 5A and 5B are cross-section views illustrating successive steps of a third embodiment of a transistor according to the present invention.
Figure 5B:
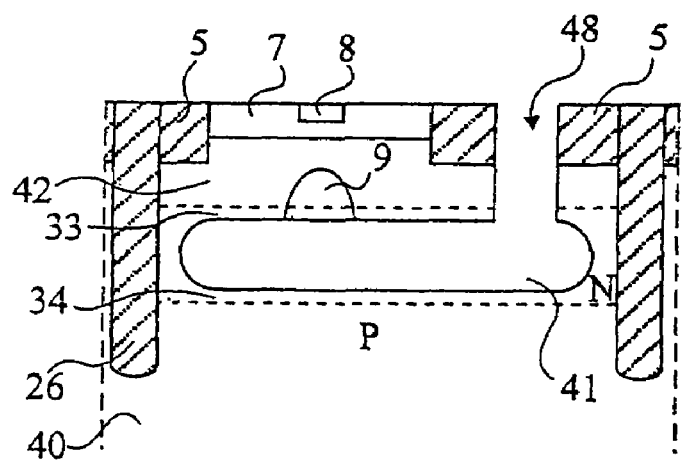

A silicon structure comprising in a substrate 40 a cavity 41 may also be used, as shown in FIG. 5A. Such a cavity 41 may be formed by etching into the upper substrate surface close narrow grooves and by performing a high-temperature anneal. A cavity then forms substantially at the location of the groove bottom and the upper silicon surface obturates again. Doping processings are then performed so that layer 42 above the cavity is lightly N-type doped if the substrate is P-type doped.

Then, a heavily-doped N-type region is formed on either side of the cavity and the process carries on in the same way as described previously by first forming the elements of a transistor, then boring an opening 48 which will join cavity 41. This cavity is then filled, for example, by TiN as described previously. To form the heavily-doped N regions around the cavity, it is possible, prior to the cavity filing, to diffuse an N-type doping, for example, from polysilicon.

Of course, the present invention is likely to have various alterations, modifications, and improvements which will readily occur to those skilled in the art, especially as concerns the choice of the filling materials and the etch modes. The basic idea of the present invention is to create an inhomogeneous layer portion with respect to the polysilicon at the location where a buried layer is desired to be formed and, after having formed a port to this inhomogeneous region, to re-etch this region to form a void therein, which is then filled with a very conductive material. In the context of the first two manufacturing examples, the layer portion is a portion of a continuous layer delimited by a continuous peripheral wall. It could also be provided that, before epitaxy of the upper layer, a layer portion having the desired contour, for example, a basin etched in the substrate, is directly formed.

Further, the present invention has been described only in the context of the forming of the collector of an NPN-type transistor. It will of course apply to the forming of a collector of a PNP-type bipolar transistor. It will more generally apply to the forming of a buried layer with a very high conductivity level everywhere such a layer may be useful. The present invention especially applies in the context of submicronic structures in which, for example, the active surface area delimited by deep insulating wall 26 has a dimension on the order of 0.8×1.4 μm² and in which the layer thicknesses have values on the order of one tenth of a micrometer.

It should also be noted that the buried layer according to the present invention is not only a good electric conductor, but also a good heat conductor. Thus, a specific advantage of the present invention is that the heat dissipation of the device arranged above the buried layer is improved. The upper structure of the collector well may be optimized to improve this heat dissipation.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a buried layer in a semiconductor substrate of an integrated circuit, comprising successive steps of:
   providing a structure comprising a stacking of layers among which, at the location where the buried layer is to be formed, a layer portion is disposed within the stacking of layers, the layer portion being made of a material different from that of the semiconductor substrate such that the layer portion is selectively etchable with respect to the semiconductor substrate,
   doping the semiconductor substrate according to a chosen conductivity type on above and below and adjacent to said layer portion,
   forming an opening extending from the integrated circuit surface to said layer portion,
   removing said layer portion by isotropic etch, and
   filling the cavity thus formed with a metal-type material.

2. The method of claim 1, wherein the layer portion is delimited by an insulating wall.

3. The method of claim 1, wherein the layer portion is a silicon-germanium region formed by epitaxy on a silicon substrate and itself covered with a silicon epitaxial layer.

4. The method of claim 1, wherein the layer portion is a silicon oxide region, formed on a silicon substrate and coated with a silicon layer.

5. The method of claim 1, wherein the layer portion is a hollowed region formed in advance in the semiconductor substrate.

6. A method of forming regions in a first substrate, comprising;
   forming a buried layer of a first conductivity type having a cavity therein, such that a first portion of the buried layer is above the cavity and a second portion of the buried layer is below the cavity; and
   after forming the buried layer, forming a region of metal-type material within the cavity of the buried layer, the region of metal-type material having a vertical extent and a horizontal extent greater than the vertical extent, the horizontal extent being parallel to a surface of the first substrate.

7. The method of claim 6, wherein forming the buried layer comprises forming a sub-collector layer of a bipolar transistor.

8. The method of claim 6, wherein the metal-type material is titanium nitride.

9. The method of claim 6, wherein the metal-type material is selected from the group consisting of conductive oxides, metal silicides, titanium nitride, tantalum nitride, and copper.

10. The method of claim 6, wherein forming the region of metal-type material comprises forming a core of the buried layer.

11. The method of claim 6, further comprising forming a collector well that contacts the region of metal-type material, the collector well comprising a material of composition substantially a same composition as the metal-type material.

12. The method of claim 6, further comprising:
   forming a trench extending through at least a portion of the buried layer to a sacrificial region.

13. The method of claim 12, wherein the sacrificial region comprises SiGe.

14. The method of claim 13, further comprising:
   removing at least a portion of the sacrificial region.

15. The method of claim 14, wherein the removing of the at least a portion of the sacrificial region comprises isotropically etching the sacrificial region.

16. The method of claim 14, wherein the region of metal-type material is formed after the removing of the at least a portion of the sacrificial region.

17. The method of claim 12, wherein the sacrificial region comprises silicon oxide.

18. The method of claim 12, wherein the forming of the trench comprises anisotropically etching at least one region of the first substrate.

19. The method of claim 18, wherein the anisotropically etching comprises a anisotropically etching a silicon oxide well followed by anisotropically etching of a silicon epitaxial layer.

20. The method of claim 12, wherein the region of metal-type material is formed after the forming of the trench.

21. The method of claim 6, wherein the region of metal-type material is formed at least partially using a chemical vapor deposition process.

22. The method of claim 6, wherein the region of metal-type material is formed at least partially using an atomic deposition (ALD) process.

23. The method of claim 6, further comprising:
    forming a first recess in a second substrate;
    forming a second recess in a third substrate; and
    joining the second substrate and the third substrate to form the first substrate such that the cavity is formed from the first recess and the second recess.

24. The method of claim 23, wherein joining the second substrate and the third substrate comprises performing a high-temperature anneal.

25. The method of claim 24, further comprising;
    doping regions of the first substrate in the vicinity of the cavity to form the buried layer of the first conductivity type.

26. The method of claim 23, wherein the second substrate is of the first conductivity type and the third substrate is of a second conductivity type.

27. The method of claim 26, wherein the forming of the region of metal-type material is performed after doping the regions of the first substrate and the second substrate.

28. The method of claim 23, further comprising;
    forming a trench through the first substrate to the cavity.

29. The method of claim 6, wherein forming the region of metal-type material comprises filling the cavity with the metal-type material.

30. The method of claim 6, wherein the region of metal-type material contacts the buried layer on both a top and bottom of the region of metal-type material.

31. The method of claim 6, wherein the metal-type material is a different material than the material of which the first substrate is formed.

* * * * *